(12) United States Patent
Li et al.

(10) Patent No.: US 9,992,887 B2
(45) Date of Patent: Jun. 5, 2018

(54) PROTECTIVE COVER FOR PORTABLE ELECTRONIC DEVICE

(71) Applicants: Yong-Peng Li, Shenzhen (CN); Zhi-Ming Wang, Shenzhen (CN)

(72) Inventors: Yong-Peng Li, Shenzhen (CN); Zhi-Ming Wang, Shenzhen (CN)

(73) Assignees: HONG FU JIN PRECISION INDUSTRY (TAIYUAN) CO, Taiyuan (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days. days.

(21) Appl. No.: 15/350,088

(22) Filed: Nov. 13, 2016

(65) Prior Publication Data

US 2017/0142853 A1    May 18, 2017

(30) Foreign Application Priority Data

Nov. 13, 2015   (CN) .......................... 2015 1 0774071

(51) Int. Cl.
| | |
|---|---|
| *H04M 1/00* | (2006.01) |
| *H04B 1/38* | (2015.01) |
| *H05K 5/02* | (2006.01) |
| *A45C 11/00* | (2006.01) |
| *A45C 13/00* | (2006.01) |

(Continued)

(52) U.S. Cl.
CPC ............ *H05K 5/0217* (2013.01); *A45C 11/00* (2013.01); *A45C 13/002* (2013.01); *A45C 13/004* (2013.01); *H04B 1/3888* (2013.01); *H05K 5/0086* (2013.01); *H05K 5/03* (2013.01); *A45C 2011/001* (2013.01); *A45C 2011/002* (2013.01); *A45C 2011/003* (2013.01)

(58) Field of Classification Search
CPC .......... H04M 1/04; H04M 1/15; H04M 1/185; H04M 1/6058; H04B 1/3888
USPC .................................. 455/90.3, 575.1, 575.8
See application file for complete search history.

(56) References Cited

U.S. PATENT DOCUMENTS

| | | | |
|---|---|---|---|
| 8,070,500 B2 * | 12/2011 | Li ........................ | H04B 1/3816 455/575.1 |
| 8,365,887 B2 * | 2/2013 | Fischer .............. | B65H 75/4431 191/12.2 A |

(Continued)

FOREIGN PATENT DOCUMENTS

| | | |
|---|---|---|
| CN | 203135955 U | 8/2013 |
| KR | 10-2013-0123176 A | 11/2013 |

*Primary Examiner* — Quochien B Vuong
(74) *Attorney, Agent, or Firm* — ScienBiziP, P.C.

(57) ABSTRACT

A protective cover for a portable electronic device, which is configured for supporting the device and for storing an earphone and cable, includes a casing body, a winding portion, a limiting plate, and a support plate. The device is received in a receiving portion in the casing body and the winding portion protrudes out of one side of the casing body spaced apart from the receiving portion, the winding portion being able to accept the cable of the earphone wound onto it. The limiting plate covers one side of the winding portion spaced apart from the casing body and defining an opening. The support plate covers the opening of the limiting plate and is rotatably coupled to the limiting plate. A ring-shaped accommodating space is defined between the limiting plate and the casing body for receiving the cable of the earphone wound onto the winding portion.

17 Claims, 7 Drawing Sheets

(51) Int. Cl.
*H04B 1/3888* (2015.01)
*H05K 5/00* (2006.01)
*H05K 5/03* (2006.01)

(56) References Cited

U.S. PATENT DOCUMENTS 8,695,913 B2 * 4/2014 Cheng .................... H01R 13/60
 242/388
8,857,691 B2 * 10/2014 Monaco ................. A45C 11/00
 224/269
9,407,048 B2 * 8/2016 George ................. H01R 13/72
9,409,747 B2 * 8/2016 Grassi ................ B65H 75/4431

* cited by examiner

PROTECTIVE COVER FOR PORTABLE ELECTRONIC DEVICE

FIELD

The subject matter herein generally relates to protective covers, and particularly, to a protective cover for a portable electronic device.

BACKGROUND

A protective cover can receive a portable electronic device, thus providing support and protection to the portable electronic device.

BRIEF DESCRIPTION OF THE DRAWINGS

Implementations of the present technology will now be described, by way of example only, with reference to the attached figures.

DETAILED DESCRIPTION

Figure 1:
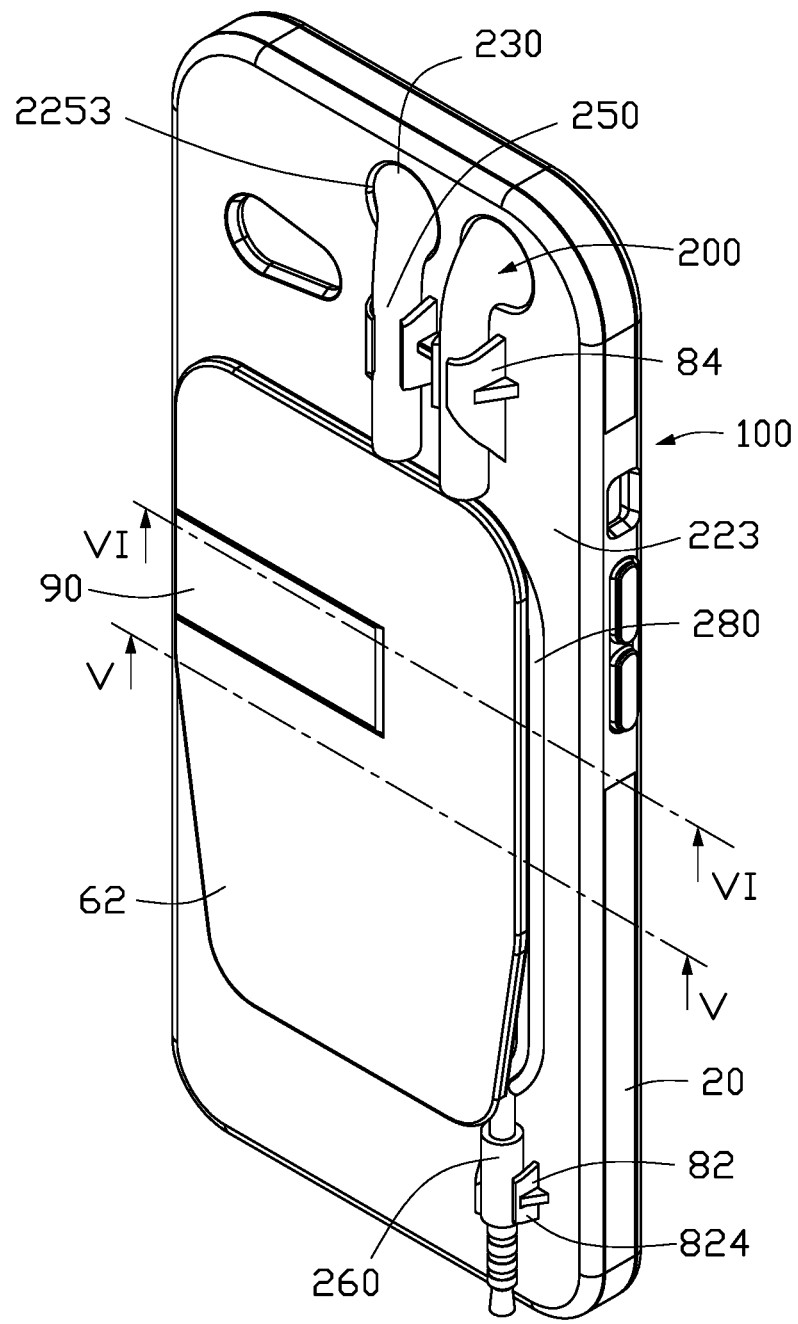
FIG. 1 is an isometric view of an embodiment of a protective cover.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

A definition that applies throughout this disclosure will now be presented. The term "comprising" when utilized, means "including, but not necessarily limited to"; it specifically indicates open-ended inclusion or membership in the so-described combination, group, series, and the like.

The present disclosure is described in relation to a protective cover configured for receiving a portable electronic device and an earphone.

FIG. 1 illustrates a protective cover 100 including a casing body 20. The protective cover 100 can be configured for receiving a portable electronic device (not shown). The portable electronic device can be, but is not limited to, a mobile phone or a tablet computer. In this embodiment, the portable electronic device can be a mobile phone. The casing body 20 can have a shape similar to that of the portable electronic device, and a back surface and four side surfaces of the mobile phone can be closely attached to the casing body 20, thus the mobile phone can be received in the casing body 20.

The mobile phone can be equipped with an earphone 200. The earphone 200 can include two ear plugs 230, two ear plug columns 250, an earphone jack 260, and a cable 280. Each of the ear plugs 230 can be coupled to one end of the ear plug column 250 and connected to one end of the cable 280. The ear plug jack 260 is coupled to the other end of the cable 280. The ear plug jack 260 can be coupled to the mobile phone.

The casing 20 can define two earphone receiving holes 2253 configured for receiving the two ear plugs 230. The casing body 20 can include a first clamping portion 82 configured for clamping the earphone jack 260 and two second clamping portions 84 configured for clamping the ear plugs 250. Each of the first clamping portion 82 and the two second clamping portions 84 can include two elastic arms 824 facing each other, to clamp an object. The first clamping portion 82 can be arranged at one end of the bottom plate 223 spaced apart from the earphone receiving holes 2253, and the two second clamping portions 84 can be arranged near the two earphone receiving holes 2253.

Figure 2:
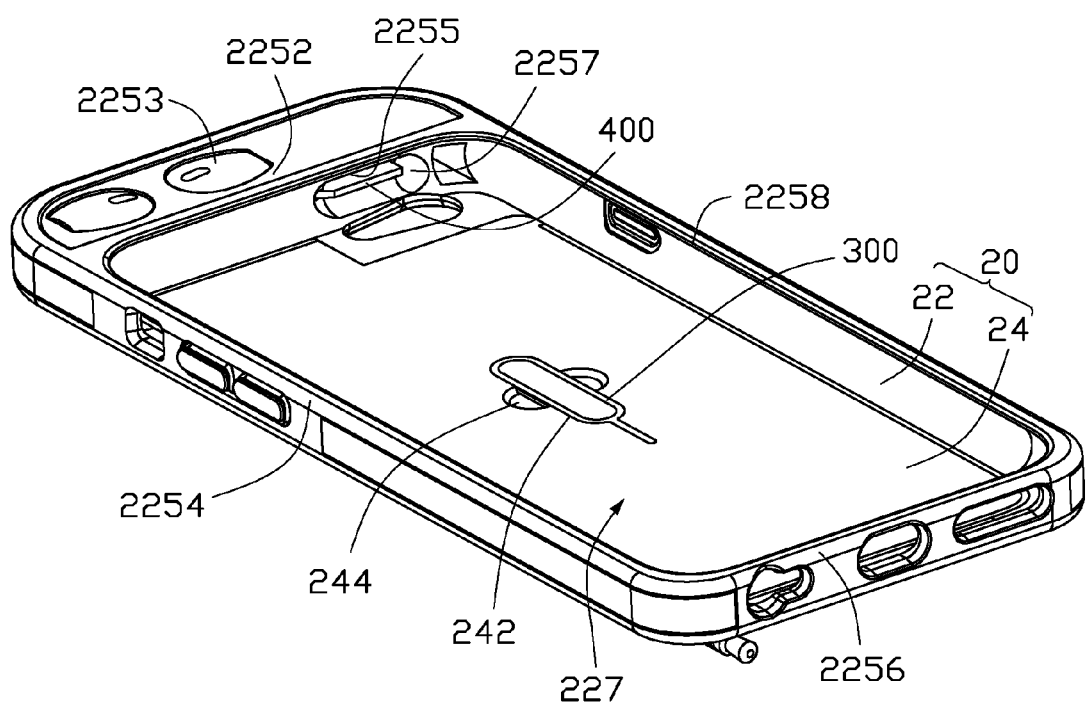
FIG. 2 is an isometric view of the protective cover shown in FIG. 1, but viewed from another angle.
Figure 5:
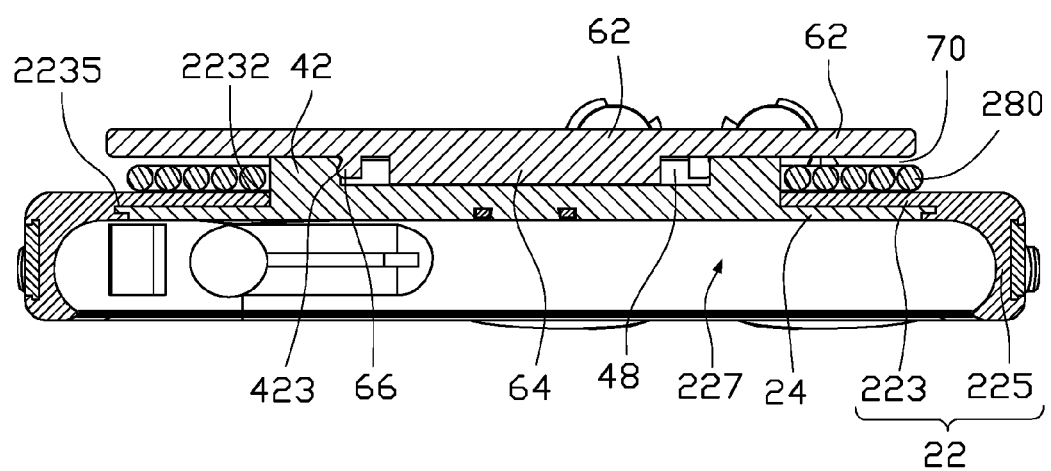
FIG. 5 is a cross-sectional view of the protective cover taken along line V-V of FIG. 1.

FIG. 2 and FIG. 5 illustrate that the casing body 20 can include a main body 22 and an embedded member 24. The main body 22 can include a bottom plate 223 and four side plates 225 extending from edges of the bottom plate 223. The bottom plate 223 and the four side plates 225 cooperatively form a receiving space 227 configured for receiving the mobile phone. In at least one embodiment, the bottom plate 223 can be substantially rectangular and can define a through hole 2232 and a latching groove 2235. The through hole 2232 can be defined at about the central portion of the bottom plate 223, and the latching groove 2235 can be recessed on a surface of the bottom plate 223 toward the receiving portion 227 and in communication with the through hole 2232. The side plates 225 can be a first side plate 2252, a second side plate 2254, a third side plate 2256, and a fourth side plate 2258. The first side plate 2252 can be parallel to the third side plate 2256, and the second side plate 2254 can be parallel to the fourth side plate 2258. A width of the first side plate 2252 can be larger than a width of the third side plate 2256.

One side of the embedded member 24 toward the receiving portion 227 can define a pin receiving groove 242 configured for receiving a pin 300. The embedded member 24 can further define two first grooves 244 at opposing sides of the pin receiving groove 242, thus the pin 300 can be easily taken out from the pin receiving groove 242. One side of the first side plate 2252 toward the receiving portion 227 can define a smart card receiving groove 2255. The first side plate 2252 can further define two second grooves 2257 at opposing sides of the smart card receiving groove 2257, thus a standby smart card 400 can be easily taken out from the smart card receiving groove 2255. In at least one embodiment, the smart card 400 is a Subscriber Identity Module (SIM) card. In other embodiments, the smart card 400 can be a memory card. When user need to connect the standby smart card 400 with the mobile phone, user can take the smart card 400 out from the smart card receiving groove 2255 using the pin 300.

Figure 3:
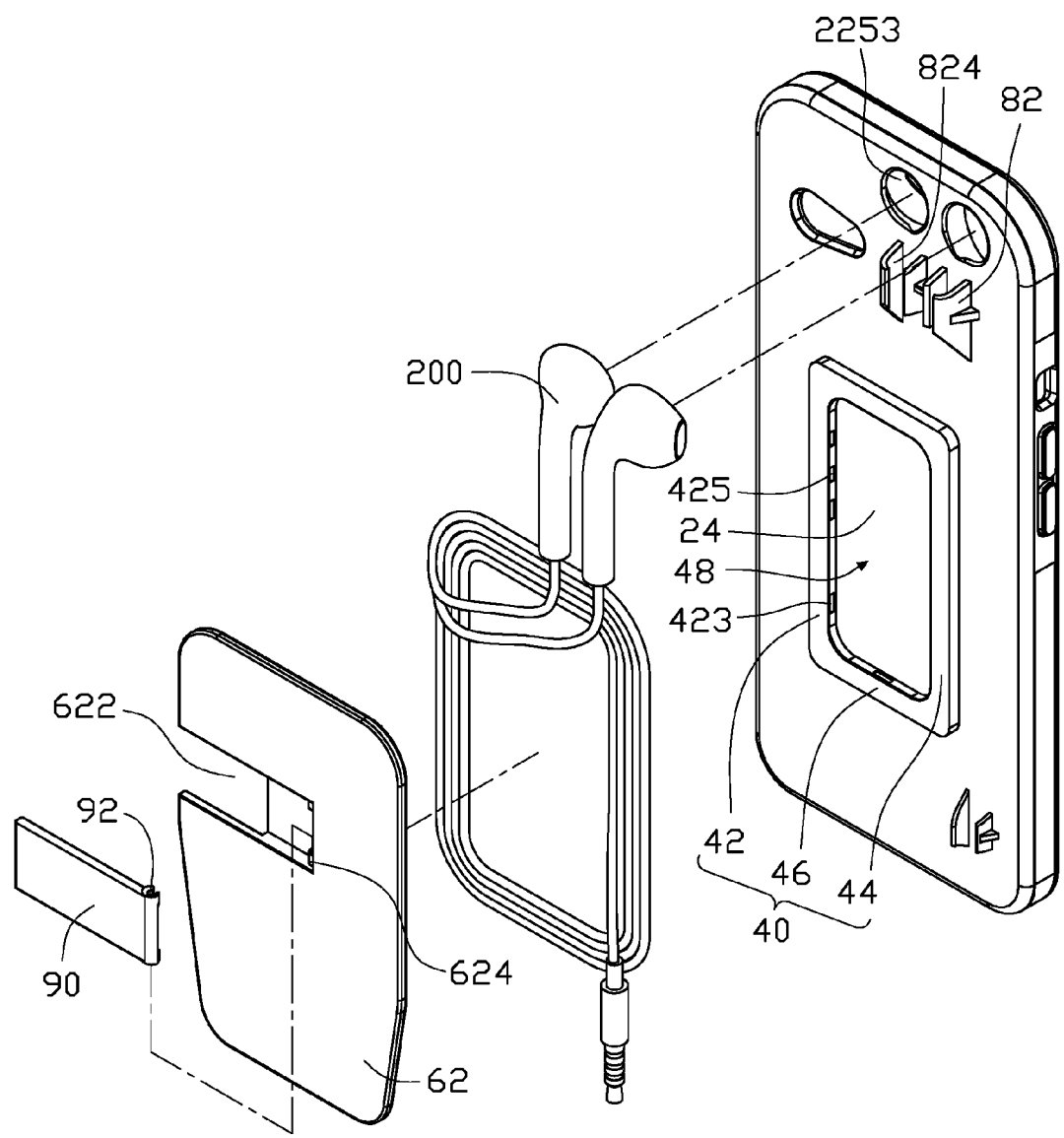
FIG. 3 is an exploded, isometric view of the protective cover shown in FIG. 1.

FIG. 3 and FIG. 5 illustrate that the embedded member 24 can be partially received in the latching groove 2235. The embedded member 24 can include a winding portion 40. The winding portion 40 can protrude out of the side of the embedded member 24 spaced apart from the receiving portion 227. The winding portion 40 can include a first linear portion 42, a second linear portion 44, and two connecting portions 46. The first linear portion 42, the second linear portion 44, and the two connecting portions 46 can cooperatively form a mounting portion 48. In at least one embodiment, the first winding portion 40 can be integrally formed with the embedded member 24. The protective cover 100 can further include a limiting plate 62. The limiting plate 62 can be substantially rectangular. The limiting plate 62 can cover one side of the winding portion 40 spaced apart from the casing body 20.

Figure 4:
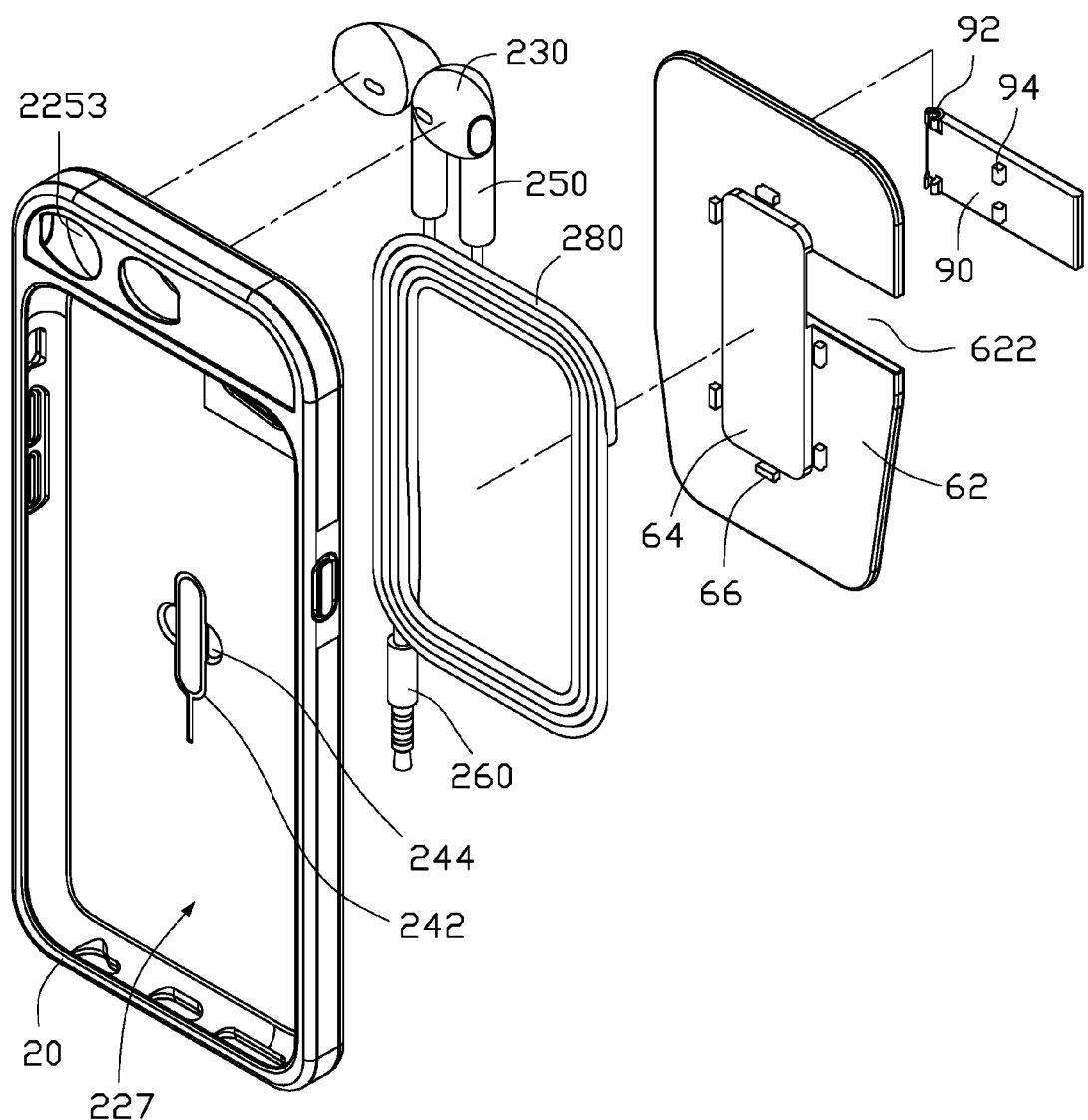
FIG. 4 is an exploded, isometric view of the protective cover shown in FIG. 1, but viewed from another angle.

FIG. 3, FIG. 4, and FIG. 5 illustrate that one side of the limiting plate 62 toward the winding portion 40 can include a protruding portion 64 and five clamping portions 66. The protruding portion 64 can be substantially rectangular and formed at a central portion of the limiting plate 62, to be received in the mounting portion 48. One side of the protruding portion spaced apart from the limiting plate 62 can be adhesively attached to the embedded member 24, thereby the limiting plate 62 can cover the first linear portion 42 and the second linear portion 44. In at least one embodiment, the clamping portions 66 can be clasps, and the five clamping portions 66 can be arranged around the protruding portion 64. Each of the first linear portion 42, the second linear portion 44, and the two connecting portions 46 can define a latching hole 423, and each clamping portion 66 can be latched into a latching hole 423. In other embodiments, the number of latching portions 66 can be two, three, four, or more than five.

The limiting plate 62 can be larger than the mounting portion 48, thereby the limiting plate 62, the winding portion 40, and the main body 22 can cooperatively form a ring-shaped accommodating space 70. The accommodating space 70 can be configured for receiving the cable 280 around the winding portion 40. After the cable 280 is wound on the winding portion 40, the cable 90 can be received in the accommodating space 70.

Figure 6:
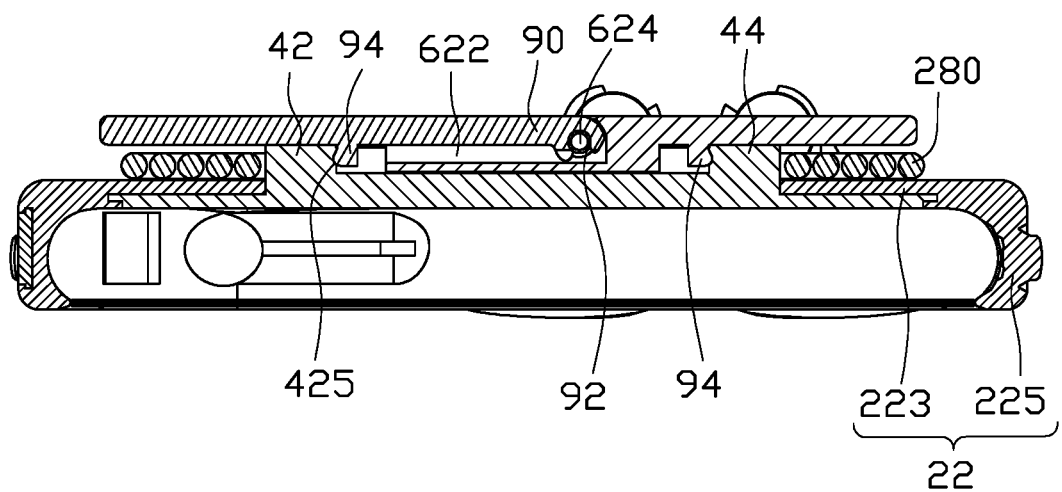
FIG. 6 is a cross-sectional view of the protective cover taken along line VI-VI of FIG. 1.

FIG. 3 and FIG. 6 illustrate that the limiting plate 62 can define an opening 622. In at least one embodiment, the opening 622 extends from a portion adjacent to the second linear portion 44 to an outer edge of the limiting plate 62. The protective cover 100 can further include a support plate 90 covering the opening 622. One side of the support plate 90 spaced apart from the first linear portion 42 can be rotatably connected to the limiting plate 62. The limiting plate 62 can further include two mounting shafts 624. The limiting plate 62 can protrude from the bottom of the opening 622 of the limiting plate 62 and positioned near the second linear portion 44. One side of the support plate 90 spaced apart from the first linear portion 42 can include two pivoting portions 92 corresponding to the two mounting shafts 624. Each mounting shaft 624 can be rotatably received in a pivoting portion 92, thereby the support plate 90 can be rotatably connected to the limiting plate 62.

In at least one embodiment, one side of the support plate 90 can include a clasp 94 protruding toward the first linear portion 42, and one side of the first linear portion 42 toward the second linear portion 44 can define a locking groove 425 coupling to the clasp 94. The locking groove 425 can be defined spaced from the latching hole 423. The clasp 94 can be snapped into the latching hole 423, thus the support plate 90 will not rotate relative to the mounting shaft 624.

In at least one embodiment, the embedded member 24, the first linear portion 42, the second linear portion 44, the two connecting portion 46, and the limiting plate 62 can be made of polycarbonate plastic, providing a protective cover 100 with high strength. The main body 22 can be made of thermoplastic polyurethane (TPU), thus the protective cover 100 can have good impact-resistance. The embedded member 24, the first linear portion 42, the second linear portion 44, the two connecting portions 46, and the main body 22 can be made by a two-shot molding process.

In assembling the protective cover 100, the protruding portion 64 of the limiting plate 62 can be attached to the main body 22, and the limiting plate 62 can cover the first linear portion 42 and the second linear portion 44. Then, the support plate 90 can be rotatably connected to the limiting plate 62.

In an initial state, the support plate 90 can be coupled to the limiting plate 62 by the clasp 94. In use, the mobile phone can be received in the receiving portion 227. When the earphone 200 is not in use, the two earphone jack 260 can be clamped by the first clamping portion 82, the cable 280 can be wound to the first linear portion 42 and the second linear portion 44, and the two ear plugs 230 can be received in the earphone receiving holes 2253.

Figure 7:
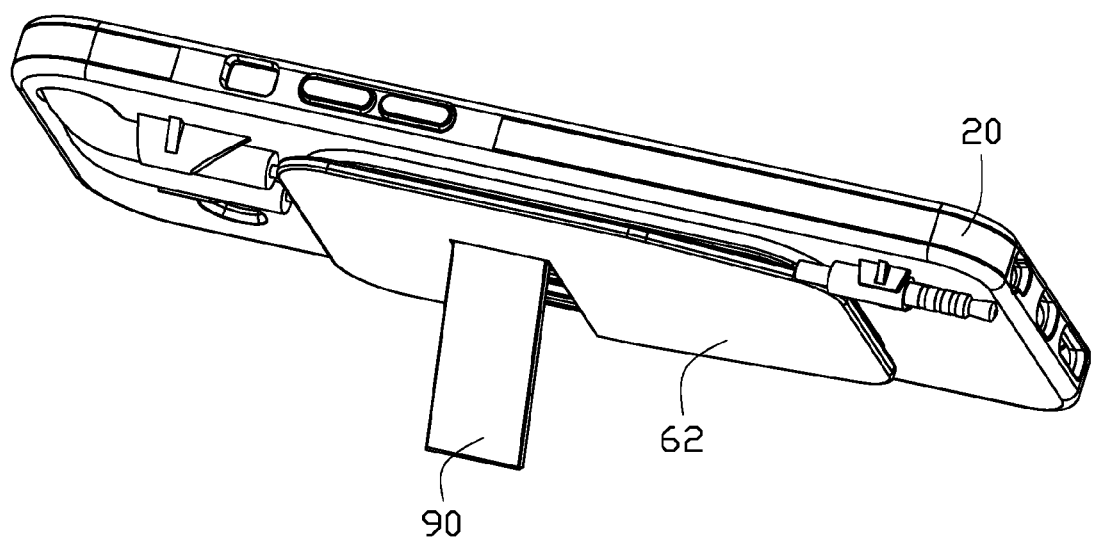
FIG. 7 is an isometric view of the protective cover of FIG. 1 in use.

The support plate 90 can be pulled by user, thus the clasp 94 can be taken out from the locking groove 425, and the support plate 90 can rotate a predetermined angle relative to the limiting plate 62. FIG. 7 illustrates that the support plate 90 can be inclined to the limiting plate 62, thus the casing body 20 (with the portable electronic device inside) can be supported by the support plate 90, and the protective cover 100 can be placed on a desk.

The limiting plate 62, the winding portion 40, and the casing body 20 of the protective cover 100 can cooperatively form a ring-shaped accommodating space 70 configured for receiving the cable 280. As the support plate 90 is rotatably connected to the limiting plate 62, the support plate 90 and the casing body 20 can support the electronic device at a predetermined angle.

In other embodiments, the limiting plate 62 can be integrally formed with the first linear portion 42 and the second linear portion 44, or mounted on the first linear portion 42 and the second linear portion 44.

In other embodiments, the embedded member 24 can be omitted, and the first linear portion 42 and the second linear portion 44 can protrude from the bottom plate 223.

In other embodiments, the second connecting portions 46 can be omitted, and the first linear portion, the second linear portion 44, and the limiting plate 62 can also cooperatively form a ring-shaped space 70.

The embodiments shown and described above are only examples. Many details are often found in the art such as the other features of a protective cover. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A protective cover configured for receiving a portable electronic device and an earphone, the protective cover comprising:

a casing body defining a receiving space configured for receiving the portable electronic device, a winding portion protruding out of a side of the casing body opposite to the receiving space, the winding portion being configured for winding a cable of the earphone therearound;

a limiting plate covering the winding portion and being spaced apart from the casing body and defining an opening;

a support plate covering the opening of the limiting plate and rotatably coupled to the limiting plate;

wherein a ring-shaped accommodating space is defined between the limiting plate and the casing body for receiving the cable of the earphone wound onto the winding portion;

wherein the winding portion comprises a first linear portion and a second linear portion parallel to and spaced apart from each other, the limiting plate covers the first linear portion and the second linear portion; and wherein one side of the support plate comprises a clasp protruding toward the first linear portion, and one side of the first linear portion toward the second linear portion defines a locking groove coupling to the clasp.

2. The protective cover of claim 1, wherein the opening extends from a portion adjacent to the second linear portion to an outer edge of the limiting plate; the limiting plate comprises a mounting shaft mounted in the opening, and the mounting shaft is arranged at one end of the opening adjacent to the second linear portion; and one side of the support plate adjacent to the second linear portion comprises a pivoting portion, and the mounting shaft is rotatably received in the pivoting portion.

3. The protective cover of claim 1, wherein one side of the limiting plate comprises a protruding portion and at least two clamping portions positioned at opposing sides of the protruding portion, the winding portion comprises a mounting portion between the first linear portion and the second linear portion, the protruding portion is attached to the mounting portion of the winding portion, each of the first winding portion and the second winding portion defines at least one latching hole corresponding to the at least two clamping portions.

4. The protective cover of claim 1, wherein the casing body further defines two earphone receiving holes configured for receiving two ear plugs of the earphone, one side of the casing body spaced apart from the receiving portion comprises a first clamping portion configured for clamping an earphone jack of the earphone and two second clamping portions configured for clamping ear plugs of the earphone, the first clamping portion is positioned at one end of the casing body spaced apart from the earphone receiving holes, and the two second clamping portions are positioned near the two earphone receiving holes; each of the first clamping portion and the two second clamping portions comprises two elastic arms facing each other.

5. The protective cover of claim 1, wherein the casing body comprises a main body and an embedded member, the main body comprises a bottom plate and four side plates extending from edges of the bottom plate, the receiving portion is formed by the bottom plate and the four side plates; the bottom plate defines a through hole and a latching groove, the latching groove is recessed on a surface of the bottom plate toward the receiving portion and in communication with the through hole, the inner part is received in the latching groove, and the winding portion protrudes from the embedded member.

6. The protective cover of claim 5, wherein one side of the embedded member defines a pin receiving groove, and two first grooves at opposing sides of the pin receiving groove.

7. The protective cover of claim 5, wherein one of the four side plates defines a smart card receiving groove toward the receiving portion, and two second grooves at opposing sides of the smart card receiving groove.

8. The protective cover of claim 5, wherein the embedded member, the winding portion, and the limiting plate are made of polycarbonate plastic, and the main body is made of thermoplastic polyurethane.

9. A protective cover configured for receiving a portable electronic device and an earphone, the protective cover comprising:

a casing body defining a receiving space configured for receiving the portable electronic device, a winding portion protruding out of a side of the casing body spaced apart from the receiving space, the winding portion being configured for winding a cable of earphone therearound;

a limiting plate covering the winding portion and being spaced apart from the casing body;

wherein winding portion comprises a first linear portion and a second linear portion parallel to and distanced from each other, the limiting plate covers one side of the first linear portion and the second linear portion spaced apart from the casing body;

wherein a ring-shaped accommodating space is defined between the limiting plate and the casing body for receiving the cable of the earphone wound onto the winding portion; and wherein one side of the support plate comprises a clasp protruding toward the first linear portion, and one side of the first linear portion toward the second linear portion defines a locking groove coupling to the clasp.

10. The protective cover of claim 9, wherein the limiting plate defines an opening, and the protective cover further comprises a support plate covering the opening of the limiting plate and rotatably coupled to the limiting plate.

11. The protective cover of claim 9, wherein the opening extends from a portion adjacent to the second linear portion to an outer edge of the limiting plate; the limiting plate comprises a mounting shaft mounted in the opening, and the mounting shaft is arranged at one end of the opening adjacent to the second linear portion; and one side of the support plate adjacent to the second linear portion comprises a pivoting portion, and the mounting shaft is rotatably received in the pivoting portion.

12. The protective cover of claim 9, wherein one side of the limiting plate comprises a protruding portion and at least two clamping portions positioned at opposing sides of the protruding portion, the winding portion comprises a mounting portion between the first linear portion and the second linear portion, the protruding portion is attached to the mounting portion of the winding portion, each of the first winding portion and the second winding portion defines at least one latching hole corresponding to the at least two clamping portions.

13. The protective cover of claim 9, wherein the casing body further defines two earphone receiving holes configured for receiving two ear plugs of the earphone, one side of the casing body spaced apart from the receiving portion comprises a first clamping portion configured for clamping an earphone jack of the earphone and two second clamping portions configured for clamping ear plugs of the earphone, the first clamping portion is positioned at one end of the casing body spaced apart from the earphone receiving holes, and the two second clamping portions are positioned near the two earphone receiving holes; each of the first clamping portion and the two second clamping portions comprises two elastic arms facing each other.

14. The protective cover of claim 9, wherein the casing body comprises a main body and an embedded member, the main body comprises a bottom plate and four side plates extending from edges of the bottom plate, the receiving portion is formed by the bottom plate and the four side plates; the bottom plate defines a through hole and a latching groove, the latching groove is recessed on a surface of the bottom plate toward the receiving portion and in communication with the through hole, the inner part is received in the latching groove, and the winding portion protrudes from the embedded member.

15. The protective cover of claim 14, wherein one side of the embedded member defines a pin receiving groove, and two first grooves at opposing sides of the pin receiving groove.

16. The protective cover of claim 14, wherein one of the four side plates defines a smart card receiving groove toward the receiving portion, and two second grooves at opposing sides of the smart card receiving groove.

17. The protective cover of claim 14, wherein the embedded member, the winding portion, and the limiting plate are made of polycarbonate plastic, and the main body is made of thermoplastic polyurethane.

\* \* \* \* \*